United States Patent
Bhalla et al.

(10) Patent No.: US 8,053,298 B2
(45) Date of Patent: Nov. 8, 2011

(54) PLANAR SPLIT-GATE HIGH-PERFORMANCE MOSFET STRUCTURE AND MANUFACTURING METHOD

(75) Inventors: Anup Bhalla, Santa Clara, CA (US); Francois Hebert, San Mateo, CA (US); Daniel S. Ng, Campbell, CA (US)

(73) Assignee: Alpha & Omega Semiconductor Ltd., Sunnyvale, CA (US)

( * ) Notice: Subject to any disclaimer, the term of this patent is extended or adjusted under 35 U.S.C. 154(b) by 106 days.

(21) Appl. No.: 12/381,813

(22) Filed: Mar. 16, 2009

(65) Prior Publication Data
US 2009/0181503 A1 Jul. 16, 2009

Related U.S. Application Data

(62) Division of application No. 11/444,853, filed on May 31, 2006, now Pat. No. 7,504,676.

(51) Int. Cl.
*H01L 21/337* (2006.01)
(52) U.S. Cl. ............... 438/186; 257/E21.421
(58) Field of Classification Search .............. 438/186
See application file for complete search history.

(56) References Cited

U.S. PATENT DOCUMENTS

| | | | | |
|---|---|---|---|---|
| 4,393,575 A | * | 7/1983 | Dunkley et al. | 438/186 |
| 5,635,416 A | * | 6/1997 | Chen et al. | 438/258 |
| 6,639,276 B2 | * | 10/2003 | Spring et al. | 257/341 |
| 6,791,143 B2 | * | 9/2004 | Baliga | 257/328 |
| 6,800,897 B2 | * | 10/2004 | Baliga | 257/328 |
| 6,919,241 B2 | * | 7/2005 | Kinzer et al. | 438/194 |
| 7,378,317 B2 | * | 5/2008 | de Fresart et al. | 438/268 |
| 7,411,231 B2 | * | 8/2008 | Wilson et al. | 257/256 |
| 2003/0205829 A1 | * | 11/2003 | Boden, Jr. | 257/921 |

* cited by examiner

*Primary Examiner* — William D Coleman
(74) *Attorney, Agent, or Firm* — Bo-In Lin

(57) ABSTRACT

This invention discloses an improved semiconductor power device includes a plurality of power transistor cells wherein each cell further includes a planar gate padded by a gate oxide layer disposed on top of a drift layer constituting an upper layer of a semiconductor substrate wherein the planar gate further constituting a split gate including a gap opened in a gate layer whereby the a total surface area of the gate is reduced. The transistor cell further includes a JFET (junction field effect transistor) diffusion region disposed in the drift layer below the gap of the gate layer wherein the JFET diffusion region having a higher dopant concentration than the drift region for reducing a channel resistance of the semiconductor power device. The transistor cell further includes a shallow surface doped regions disposed near a top surface of the drift layer under the gate adjacent to the JFET diffusion region wherein the shallow surface doped region having a dopant concentration lower than the JFET diffusion region and higher than the drift layer.

6 Claims, 13 Drawing Sheets

7C

PLANAR SPLIT-GATE HIGH-PERFORMANCE MOSFET STRUCTURE AND MANUFACTURING METHOD

This Application is a divisional of 11/444,853 filed May 31, 2006 now U.S. Pat. No. 7,504,676.

BACKGROUND OF THE INVENTION

1. Field of the Invention

The invention relates generally to the semiconductor power devices. More particularly, this invention relates to new device configurations and manufacturing method for a metal oxide semiconductor field effect transistor (MOSFET) device with planar split gate structure to improve device performance.

2. Description of the Prior Art

Even though a semiconductor power device with planar gate structure is more compatible with multiple foundries and can be produced at a lower production cost, however, conventional technologies for manufacturing a metal oxide semiconductor field effect transistor (MOSFET) device with planar gates are still challenged by several technical difficulties and limitations. Specifically, the DMOS process produces a channel with uneven channel doping density as shown in FIG. 1D such that precision control of threshold is difficult and the device is susceptible to punch-through. As shown in FIG. 1D, the channel has a peak doping level near the source region that determines the threshold. The doping level drops sharply as the channel extends into the drift region. This channel dopant profile has some problems. First, the extent of source and body diffusion affects the peak channel doping level therefore precision control of gate threshold is difficult since that would require highly precision control of source and body diffusion. Second, the sharp decrease of doping level as the channel extends into the drift region causes dramatically reduction of the charge level in this region therefore the device is vulnerable to punch-through. Furthermore, a MOSFET device that requires a reduced capacitance for high frequency applications is still limited by a high capacitance (Cgd) at low bias due to the overlap of the planar gate over the drain region. Specifically a higher Cgd occurs due to a capacitive coupling between the planar gates and the drain across an epitaxial layer not covered with the body regions, i.e., the coupling of the planar gates to the drain across the epitaxial layer between the body regions.

A semiconductor power device usually comprises a plurality of power transistor cells in parallel. Referring to FIG. 1A for a single cell of a typical conventional vertical DMOS field effect transistor (FET) device configured with a planar structure having horizontal channel and gate, the channel is diffused from the edge of the source region near the gate. A JFET implant, e.g., a N-type dopant implant for a NMOSFET device, may be used to reduce the increase of the on-resistance caused by the lateral diffusion that pinches the drain regions between the channel regions. However, as discussed above, such device has limited high frequency applications at a low bias due to the high gate-to-drain capacitance caused by the coupling of the planar gates to drain across the epitaxial and drift regions between the body regions.

Furthermore, a DMOS device with planar gate is limited by several technical limitations that the cell pitch cannot be easily reduced. Specifically, in reducing a cell pitch of a DMOS device, a large distance between the body regions leads to a reduced breakdown voltage. On the other hand, a small distance between the body regions causes a high drain to source on-resistance Rdson. Baliga disclosed in U.S. Pat. No. 6,800,897 (issued on Oct. 5, 2005) and U.S. Pat. No. 6,791,143 (issued on Sep. 14, 2004) a SSCFET device as that shown in FIG. 1B wherein the device disclosed in the U.S. Pat. No. 6,791,143 is named as a SSCFET in a November 2003 publication where SSC stands for Silicon Semiconductor Corporation. For a n-channel MOSFET device, the SSCFET structure is implemented with retrograde N-type JFET implant region to improve device on resistance. The JFET implant region is further combined with a buried P-region to shield the gate from directly coupling to the drain as that often occurs in a conventional DMOS device. However, the SSCFET structure as shown in FIG. 1B does not provide an effective resolution to these technical difficulties due to the competing design requirements. Specifically, a high dose JFET implant for the purpose of achieving a lower resistance also compensates the P-body and the P-shield implant regions. For these reasons, the demands for high performance power device with high efficiency that is suitable for high frequency applications cannot be satisfied by the semiconductor power devices with planar gates as produced now by the conventional technologies.

In U.S. Pat. No. 6,639,276, entitled "Power MOSFET with ultra-deep base and reduced on resistance" (issued on Oct. 28, 2003), a MOSFET device is disclosed as that shown in FIG. 1C wherein the MOSFET includes a highly doped semiconductor substrate 30 to support a lightly doped epitaxial layer 31. The MOSFET device further includes highly doped source regions 33 of the same conductivity as the epitaxial layer 31 formed in respective lightly doped body regions 32 of an opposite conductivity type. The MOSFET device also includes gate insulation layers 34 formed over invertible channels 32'. The gate insulation layers 34 do not extend over the entire area of common conduction regions 35, which are located between the body regions 32. The gate insulation layers only extend over a portion of the common conduction regions 35. The insulation spacer 50 is disposed between the gate electrodes 51 and covers the remaining portions of the common conduction regions 35. The insulation spacers 50 make contact with the top surface of the epitaxial layer 31 and cover a substantial portion of each common conduction region 35. A source contact 39, which may be made from aluminum, is provided to make contact with the source regions 33 and body regions 32. Insulating sidewalls 38 and insulating top layers 37 are interposed between the gate electrodes 51 and the source contact 39 in order to insulate the two from one another. The insulating spacers 50 are drastically thickened and preferably expand over a substantial portion of the width of common conduction regions 35. The insulating spacers 50 reduce the area of the gate electrodes 51 overlying the surface of common conduction regions 35. This results in a reduced gate to drain capacitance. The MOSFET further includes deep implanted junctions 92 formed in the body of the epitaxial layer 31. The concentration of dopants in deep implanted junctions 92 may be increased. An increase in the dopant concentration of deep implanted junctions 92 allows for an increase in the dopant concentration of the common conduction region 35, which improves Rdson without sacrificing the breakdown voltage. The device shown in FIG. 1C has an improved structure over the devices as shown in FIGS. 1A and 1B. It applies a split gate configuration to reduce the gate to drain capacitance without sacrificing other performance requirements. But similar to the devices as shown in FIGS. 1A and 1B, this device is also a DMOS device that the channel 32' is formed by double diffusion process of source region 33 and body region 32. All DMOS devices share the common channel doping profile as shown in FIG. 1D. As discussed above, the device as shown in FIG. 1C has a threshold voltage that is difficult to control and a channel that is vulnerable to punch-through.

Therefore, a need still exists in the art of power semiconductor device design and manufacture to provide new manufacturing method and device configuration in forming the power devices with planar gate such that the above discussed problems and limitations can be resolved. For those of ordinary skill the art, a planar gate MOSFET device compatible with multiple foundries is desirable for reducing production cost. It is further desirable that such devices have low capacitance at low and high bias and also has low on-resistance times a gate charge product. It is further desirable that such device being more resistant to punch-through and have a precisely controlled stable threshold voltage.

SUMMARY OF THE PRESENT INVENTION

It is therefore an aspect of the present invention that the disclosures provide a new and improved semiconductor power device implemented with a uniform channel dopant profile to have a stable and precisely controllable gate threshold voltage. It is further another aspect of the present invention that the disclosures provide a new and improved semiconductor power device implemented with a channel wherein at least a portion of the channel that is close to a drift region has substantially uniform high channel doping level to increase channel charge density for prevention of punch-through. It is further another aspect of the present invention that the disclosures provide a new and improved semiconductor power device that is implemented with planar split gates to achieve high performance of low capacitance at high and low bias and low on-resistance times gate charge product such that the technical difficulties and limitation can be resolved.

It is one aspect of this invention that a blanket surface P-implant can provide a substantially uniform high channel doping density. In one preferred embodiment, the blanket implant of the shallow surface dopant layer provides channel uniformity control to achieve uniform channel conductivity such that the gate threshold can be precisely controlled. In another preferred embodiment, the blanket implant of the shallow surface dopant layer provides substantially uniform high channel doping level in at least a portion of the channel that is close to a drift region to prevent punch through.

It is another aspect of this invention that the planar gate configuration is compatible with multiple foundries and can be produced at lower production cost. Furthermore, the new and improved device configuration is scalable to higher voltages and can be implemented in broader ranges of products for different kinds of applications.

It is another aspect of this invention that the planar gate is configured as split gate with a gap opened in the center. This gap provides a JFET implant window such that the JFET implantation is a self-aligned operation.

It is another aspect of this invention that an angular body implant with a tilt angle is implemented to form a body/channel region with lateral extensions, i.e., straggle regions, with sufficient extension and dopant concentration to further avoid punch-through when the drain is at high voltages. This angular body implant is also self-aligned because the implant comes from the source side of the gate only and the polysilicon edge is inherently available to mask the ion implantations. The self-aligned process provides a benefit because the self-alignment helps to maintain proper symmetry between all body regions thus ensuring uniform doping control for both sides of the split gate cell.

It is another aspect of this invention that the gap opened in the split gate provides a window of access during manufacturing process to optimize the JFET implant and oxide thickness at the edge of gate to improve breakdown due to high electric field formed in this area. Specifically, multiple energy implant of the JFET regions between the two P-body regions of the split gate cell can be well controlled with different energy and different dosage such that the region is doped with maximized doping level to ensure lowest resistance while maximizing breakdown voltage.

Specifically, it is an aspect of the present invention to provide improved device configuration with split planar gate and new manufacturing method to produce MOSFET device with precise controlled gate threshold and improved channel punch-through resistivity, as well as with reduce capacitance and on-resistance. A blanket surface body dopant implant forming a shallow surface dopant layer supplies a uniform high channel doping density channel that provides precise controlled gate threshold and improved channel punch-through resistivity. The low resistance is achieved by forming a JFET diffusion region under the gap of the split gate. A lower on-resistance to gate charge product is also achieved with reduced gate areas by forming the gates into split gates. A planar gate MOSFET device is therefore provided with significantly improved device performance and significantly lower production cost.

Briefly in a preferred embodiment this invention discloses a metal oxide semiconductor field effect transistor (MOSFET) device. The MOSFET device includes a channel with substantially uniform doping density form by blanket implant of a shallow surface dopant layer. In another preferred embodiment, the blanket implant of the shallow surface dopant layer provides channel uniformity control to achieve uniform channel conductivity such that the gate threshold can be precisely controlled. In another preferred embodiment, the blanket implant of the shallow surface dopant layer provides a substantially uniform high channel doping level to prevent punch through. In another preferred embodiment, a planar gate padded by a gate oxide layer disposed on top of a drift layer constituting an upper layer of a semiconductor substrate wherein the planar gate further constituting a split gate including a gap opened in a gate layer whereby the a total surface area of the gate is reduced. The MOSFET device further includes a JFET (junction field effect transistor) diffusion region disposed in the drift layer below the gap of the gate layer wherein the JFET diffusion region having a higher dopant concentration than the drift region for reducing a channel resistance of the semiconductor power device. A body region is disposed in the drift layer underneath the split gate surrounding the JFET diffusion region and doped with a dopant of different conductivity type than the JFET region. The body region further encompasses a source region doped with a dopant of a same conductivity type as the JFET region wherein the source region is disposed underneath the split gate and at a distance away from the JFET diffusion region. The body region further includes a up diffused region to overcome punch through. In a different embodiment, the MOSFET device constituting a MOSFET device with a recessed top surface wherein a top portion of the drift layer is removed in an area in the gap of the split gate and in an area above the source region. In a different embodiment, a source metal filled in the gap between the split gates to further shield off the gate from the drain.

These and other objects and advantages of the present invention will no doubt become obvious to those of ordinary

BRIEF DESCRIPTION OF THE DRAWINGS

FIGS. 7A to 7D are four side cross sectional views for four alternate embodiments for accumulation channel type device of this invention.

DETAILED DESCRIPTION OF THE METHOD

Figure 2A:
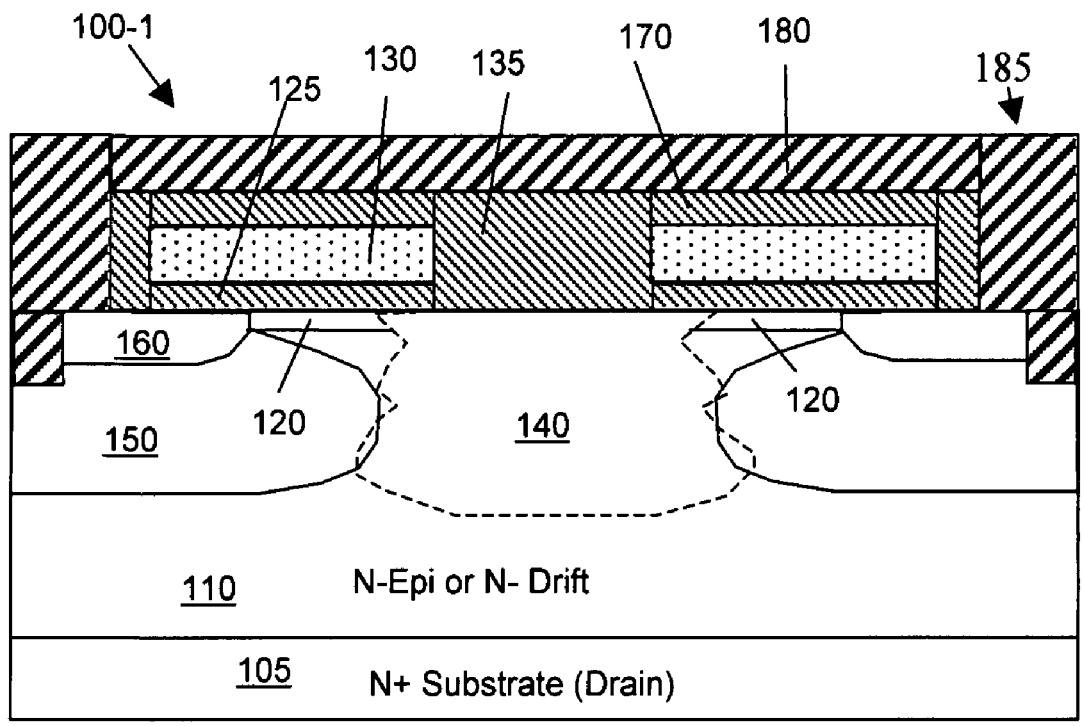
FIGS. 2A and 2B are a cross sectional view and a channel dopant profile of channel region respectively of a planar MOSFET device according to current invention.

Referring to FIG. 2A for a cross sectional view of an N-channel MOSFET device 100-1 of this invention. The trenched MOSFET device 100-1 is supported on a substrate 105 formed with an epitaxial layer 110. The MOSFET device 100-1 includes a split gate 130 with a gap opened in the polysilicon gate 130 filled with dielectric material 135. The split gate 130 is disposed above a gate oxide layer 125 formed on top of the epitaxial layer 110. The MOSFET device further includes a shallow surface doped layer 120 immediately below the gate oxide layer 125 to form a channel. In an embodiment, the shallow surface doped region 120 is formed by a blanket low dose implantation such as B+ ion dopant. A vertical and deep JFET diffusion region 140 such as an N+ diffusion region is formed in the epitaxial layer 110 under the gap of the split gate 130. This N+ region 140 counter-dopes the shallow surface doped layer and links the end of channel to the drain by extending from the top surface of epitaxial layer 110 to a bottom that is deeper than the bottom of a deep body region 150. The MOSFET device further includes deep body regions 150 that is doped with a dopant of second conductivity type, e.g., P-type dopant, extends from the bottom of shallow surface doped layer 120 to a depth that is shallower than the bottom of deep JFET diffusion region 140. The P-body regions 150 encompassing a source region 160 doped with the dopant of first conductivity, e.g., N+ dopant. The source regions 160 counter-doping the shallow surface doped layer 120 are formed near the top surface of the epitaxial layer surrounding the JFET regions 140 formed underneath the gap of the split gates 130. The top surface of the semiconductor substrate is covered by an insulation layer 170 with the insulation region 135 filling into the gap opened in the gate. The insulation layer 170 is opened with contact openings 185 and metal layer, e.g., the source metal 180 for providing electrical contacts to the source-body regions and the gates.

Figure 1A:
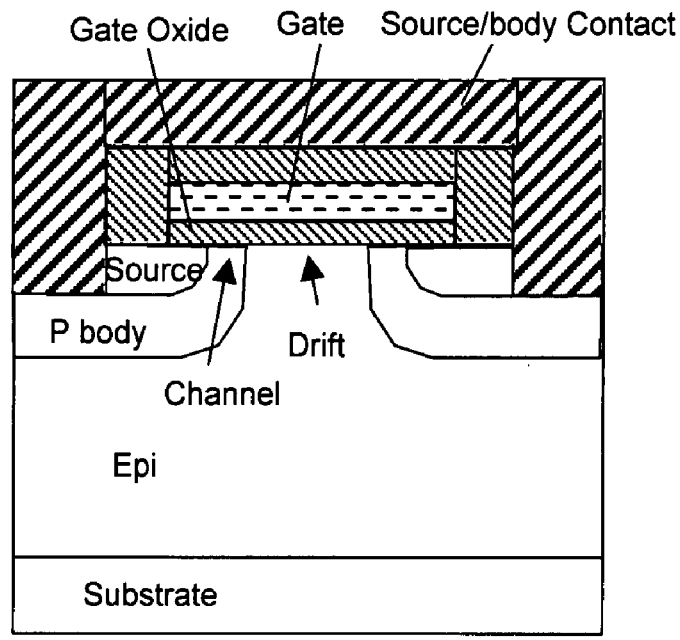
FIG. 1A is a side cross sectional view of a conventional DMOS device implemented with a planar gate.
Figure 1B:
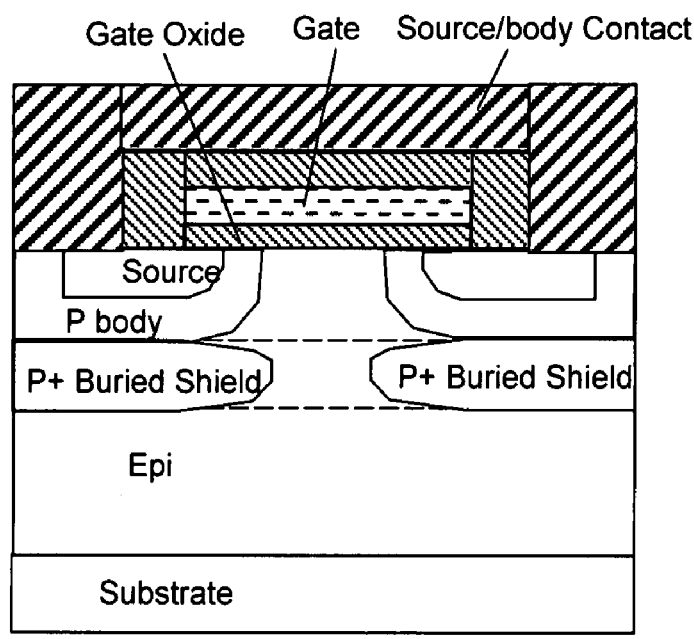
FIG. 1B is a side cross sectional view of a DMOS device disclosed in a prior art patent that includes a deep retrograde N-JFET implant region and a P+ buried shield regions.
Figure 1C:
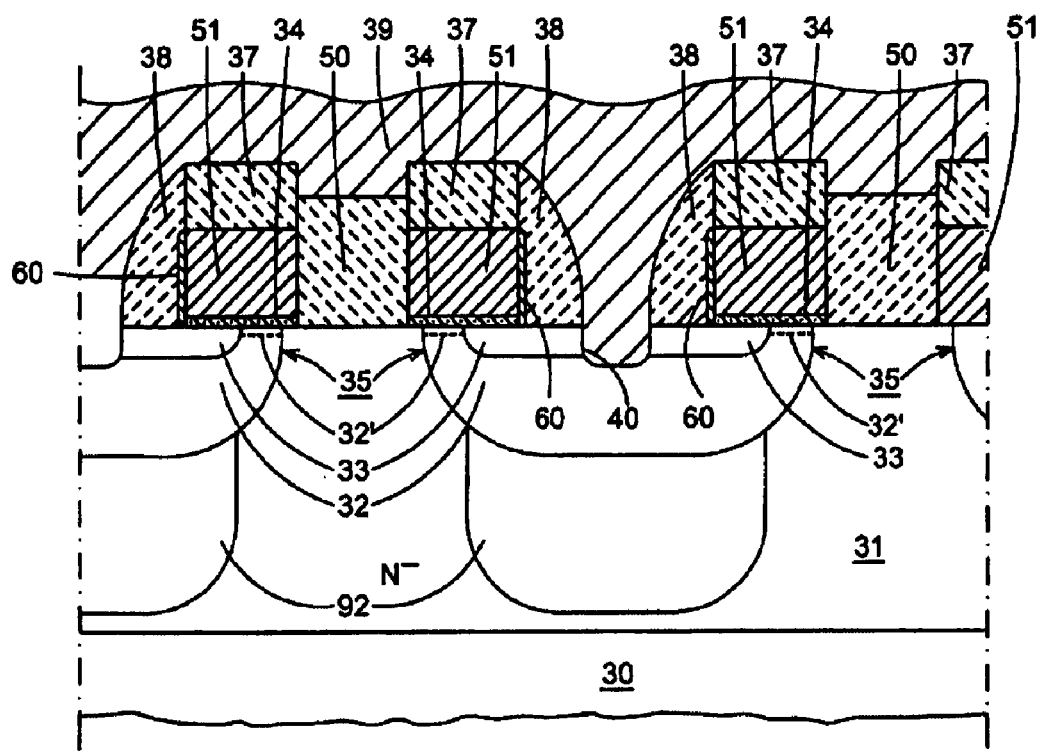
FIG. 1C is a side cross sectional view of a prior DMOS device implemented with a planar split gate.
Figure 1D:
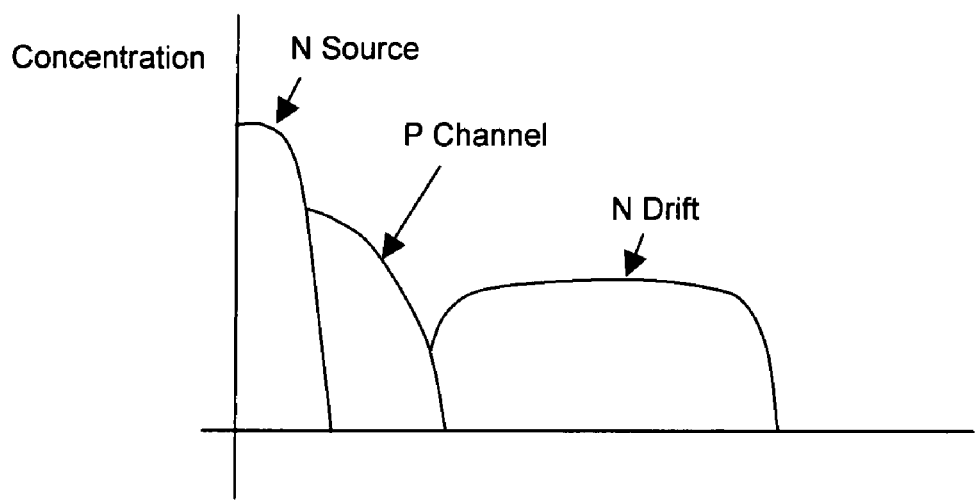
FIG. 1D is a channel dopant profile of channel region for DMOS devices shown in FIGS. 1A-1C.
Figure 2B:
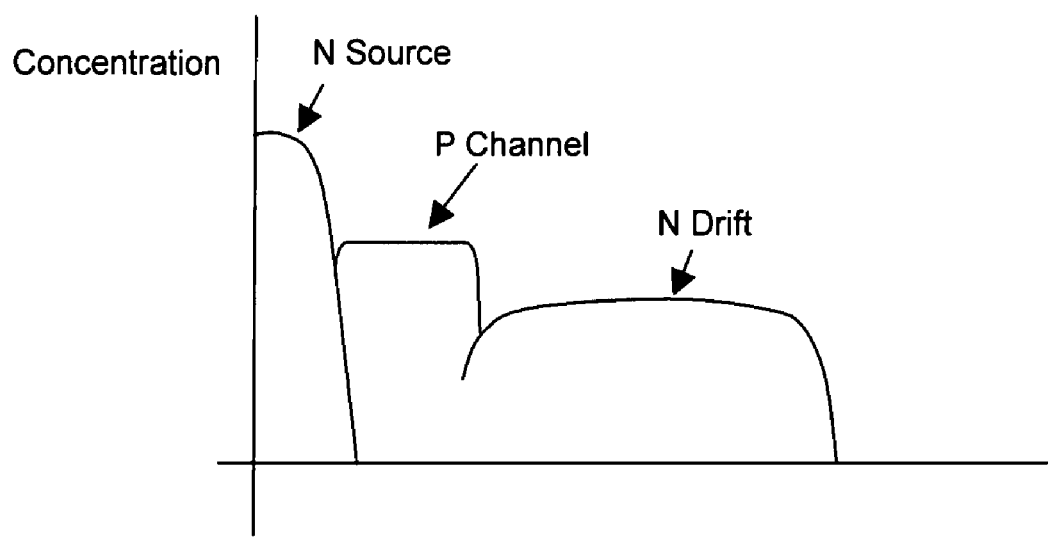

The planar device 100-1 as shown in FIG. 2A provides a novel MOSFET configuration that is completely different in concept from conventional DMOS device. Shallow surface dopant layer 120 provides a channel with constant dopant concentration as shown in FIG. 2B that is completely different from that shown in FIG. 1D. The channel length is determined by the lateral diffusions of source implant from one side and JFET implant from another side. As the channel dopant concentration is constant, the threshold voltage to invert the channel is constant. The stability of threshold voltage simplifies the control circuits in applications where precision control of gate voltage is critical.

The planar split gate structure device 100-1 as shown in FIG. 2A further provides several advantages. Low capacitances are achieved with the split gate and the JFET diffusion regions. Therefore the capacitances Crss, Cgd, etc. are reduced even at low bias because the overlap between the gate and drain in split gate design is almost eliminated. Therefore, the gate to drain capacitance Cgd is greatly reduced. Since Crss=Cgd, Crss also reduced. The difficulty that the switching speed of a semiconductor device is affected by the capacitance is therefore resolved. A high performance device is also provided because the switching speed is maintained whether at a high or a low biased condition. Small cell pitch is achieved because the increase of JFET effect of increasing the on-resistance Rdson when the cell pitch becomes smaller is no longer a limiting factor. As shown in FIG. 2A, the increase of Rdson is now compensated by the JFET implant. The JFET implant also compensates the P-Body and P-Shield implant regions. Therefore, in this invention, the limitation due to competing requirement is no longer a problem. Furthermore the self-align nature of P body implant and JFET implant provides precision process that does not require alignment error margin also helps to minimize the cell size.

With the split gates 130 that provide an opening in the gate segment during manufacturing process, the JFET diffusion regions can be conveniently formed with a self-aligned process and well-controlled dopant profile. The device configuration can be implemented with either as an N-channel or P-channel device with enhancement of depletion regions for current transmissions. The device configuration can also be conveniently implemented for accumulation channel type of structures as shown in FIGS. 7A-7D.

Furthermore, the MOSFET power device as shown may be conveniently scalable to high voltage due to the opening in the middle of gate providing easy access to the end of channel region where high electric filed caused by corner effect tends to breakdown the device can be overcome by tailoring the JFET doping profile and by optimizing the gate oxide in that region. A high performance planar gate MOSFET device with low capacitance at both high and low bias and small cell pitch is therefore available that is compatible with multiple standard foundries for low cost production. The limitations and technical difficulties as that encountered in the prior art technologies are therefore resolved.

Figure 3A:
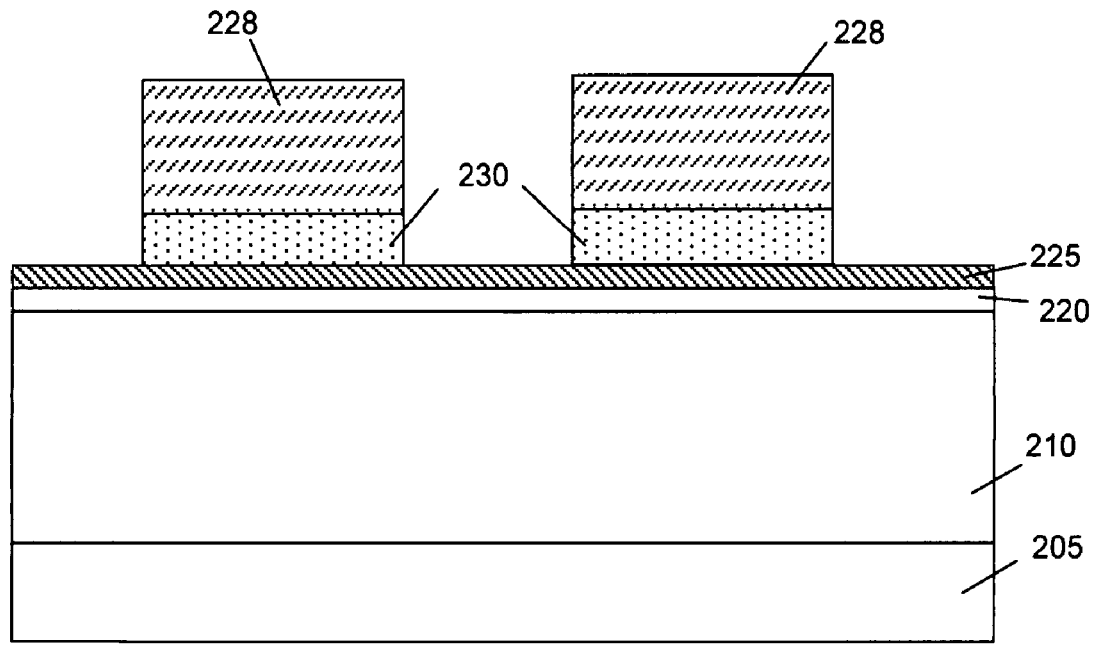
FIGS. 3A to 3D are a serial cross sectional views for describing the manufacturing processes to provide a planar MOSFET device as shown in FIG. 2.
Figure 3B:
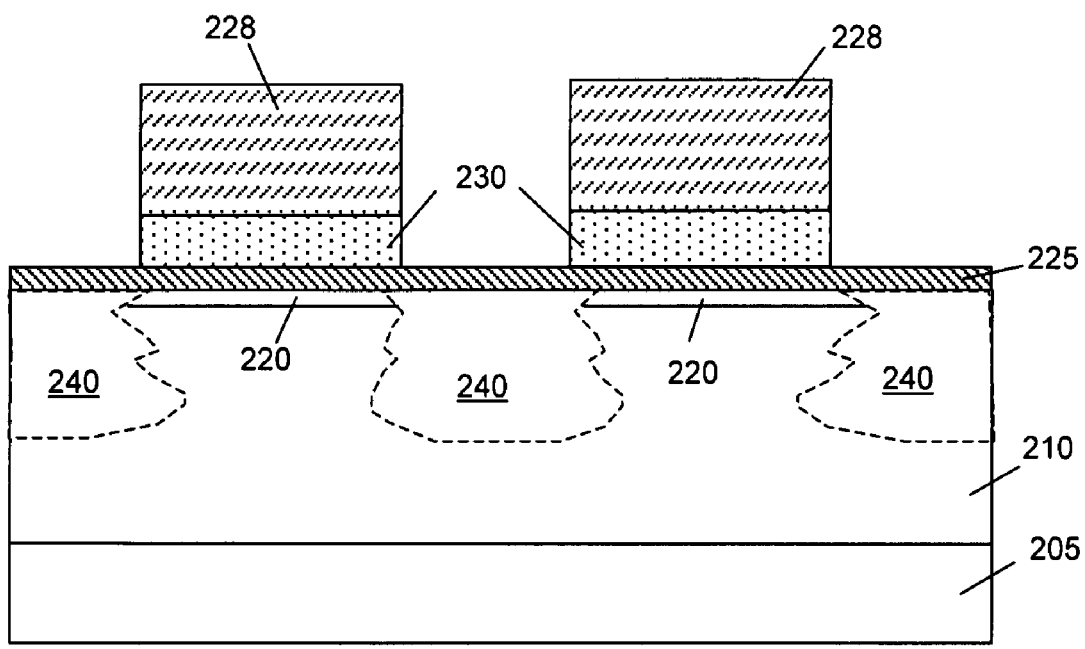

Referring to FIGS. 3A to 3D for a serial of side cross sectional views to illustrate the fabrication steps of a MOSFET device as that shown in FIG. 2A. In FIG. 3A, a field oxidation process is first carried out followed by a sacrificial oxide etch prepare a top surface of a substrate. The substrate includes an N+ bottom layer 205 functioning as a drain and a N− epitaxial layer 210 is disposed on top of the bottom layer 205. The epitaxial layer 210 functions as a drift region. A low dose blanket surface boron implant in the $10^{11}/cm^2$ to $10^{13}/cm^2$ dose range is performed to form the shallow surface dopant region 220 followed by an oxidation process to grow a gate oxide layer 225 on the top surface of the epitaxial layer 210. A polysilicon layer 230 is deposited on top of the gate oxide layer 225. A polysilicon mask 228 is applied to etch the polysilicon layer 230 into a plurality of polysilicon gates 230 with a split gate configuration. In FIG. 3B, multiple JFET implant and diffusion processes are carried out. First, a shallow phosphorus perpendicular implant is carried out to counter dope the low dose blanket surface boron implant followed by high-energy arsenic or phosphorus implantations to form the JFET regions 240.

Figure 3C:
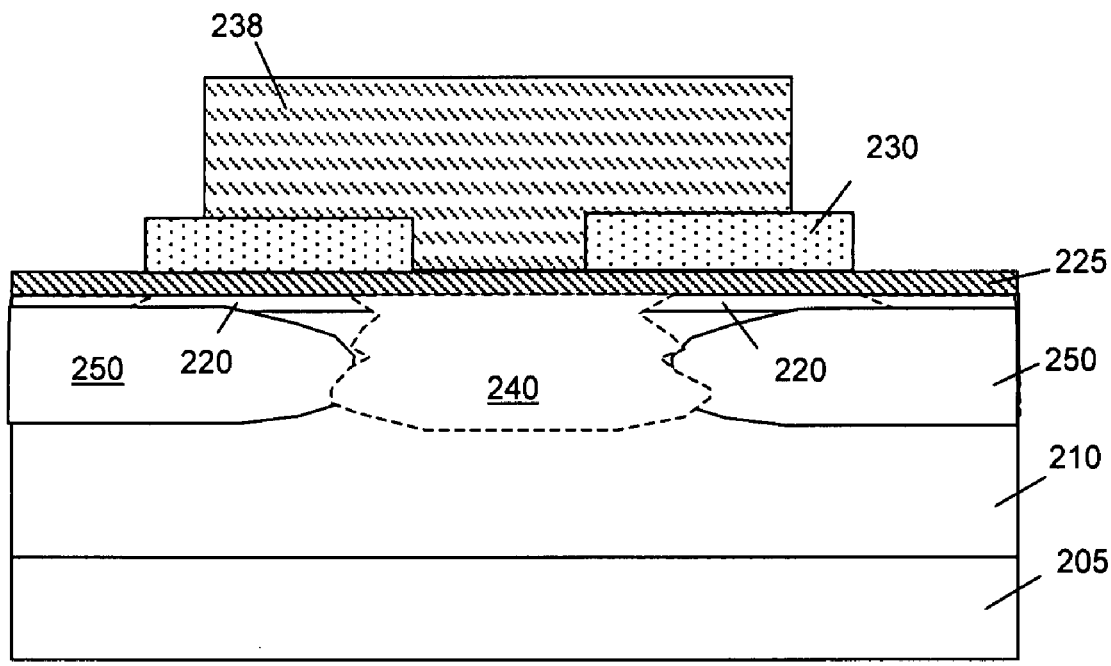
Figure 3D:
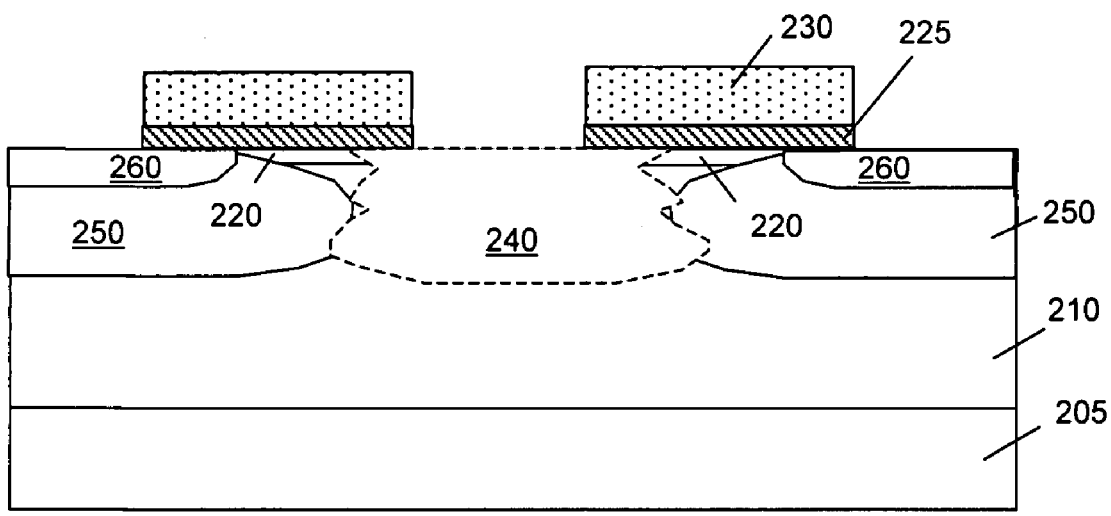

In FIG. 3C, the mask 228 is striped and a body mask 238 is applied to perform high dose deep body implant with a dopant dosage in the $5\times10^{12}/cm^2$ to $2\times10^{14}/cm^2$ range. The deep body implant process may includes tilt double or quad implant with a tilt angle of +/−7 degrees and may include shallow and deep implants with more than one depth and larger tilt angles (up to 45 degrees for example) and dosages to form the P+ body regions 250. Implant depth limit sets by the polysilicon gate thickness. In FIG. 3D, the photoresist 238 is striped. A deep diffusion is carried out at a temperature of about 1000 degree Celsius or higher for a length of 30 minutes or longer to form JFET diffusion regions 240 and deep p-body regions 250 below the shallow surface dopant regions 220. In one embodiment the JFET regions 240 extend deeper than the deep p-body regions 250. In another embodiment the JFET regions 240 are shallower than the deep p-body regions 250. The diffusion process may also form a p-body up diffusion region to stop punch through. Then a source mask (not shown) is employed to carry out a source implant to form the N+ source regions 260 followed by a source annealing operation to anneal some of gate oxide layer near the gate edges. Standard processes are then carried out to complete the manufacture of the MOSFET device. These processes include the steps of forming the insulation layers with BPSG with a reflow operation and the application of contact mask to etch the contact openings. A body contact implant is performed and annealed to form the body contact dopant regions (not shown). Then metal contacts, e.g., body/source contacts 270, are formed and patterned to form the gate pad (not shown), the source/body contacts.

Figure 4A:
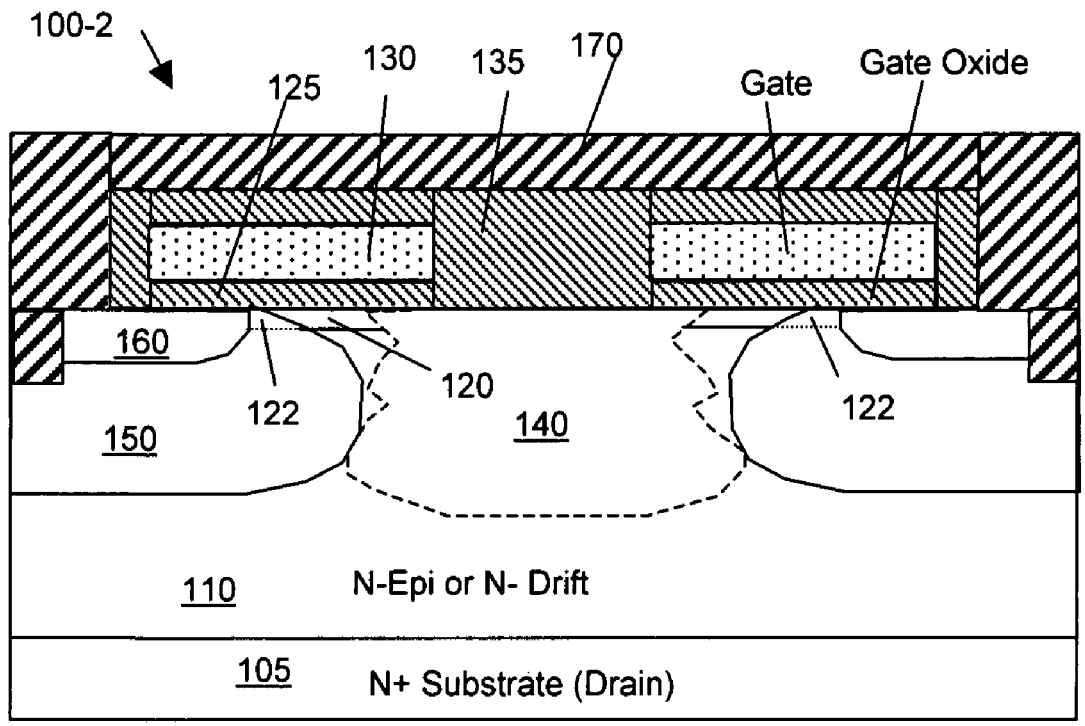
FIGS. 4A and 4B is a side cross sectional view and a channel dopant profile of channel region respectively for an alternate embodiment of this invention.
Figure 4B:
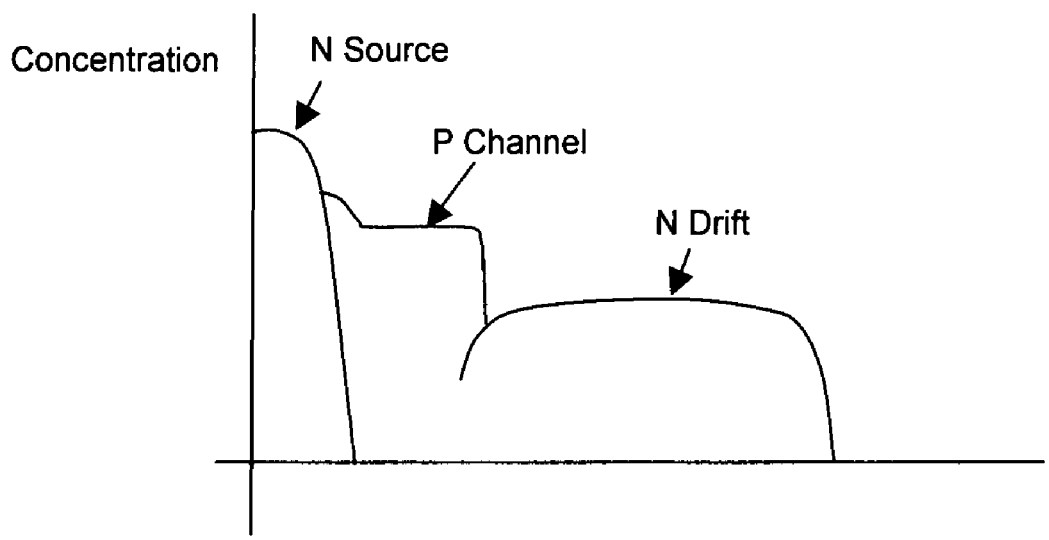

Referring to FIG. 4A for another MOSFET device 100-2 as an alternate preferred embodiment of this invention. The MOSFET device 100-2 has a similar device configuration as FIG. 2A. The only difference is that in MOSFET device 100-2 the P+ region up diffuses into a portion of the shallow surface doped layer 120 forming a portion of channel 122. As the channel portion 122 has higher dopant density as shown in FIG. 4B, the threshold is now determined by this higher dopant channel region. The precision and stability of threshold therefore can not be as precise controlled. However the substantially uniform and high channel dopant density improves the channel punch-through resistance.

Figure 5A:
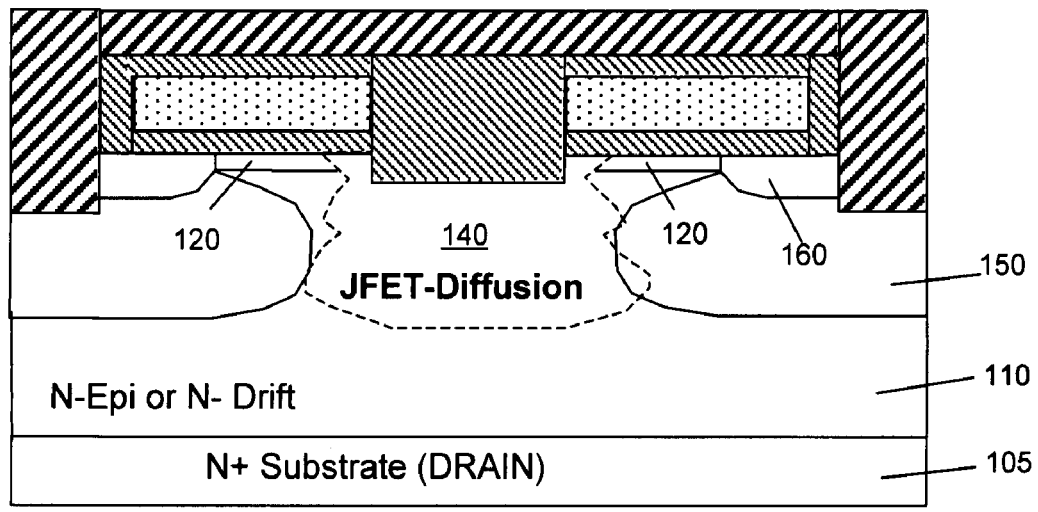
FIGS. 5A and 5B are two alternate cross sectional views of improved planar MOSFET with a portion of top surface of the substrate not covered by the gate oxide is recess according to this invention.
Figure 5B:
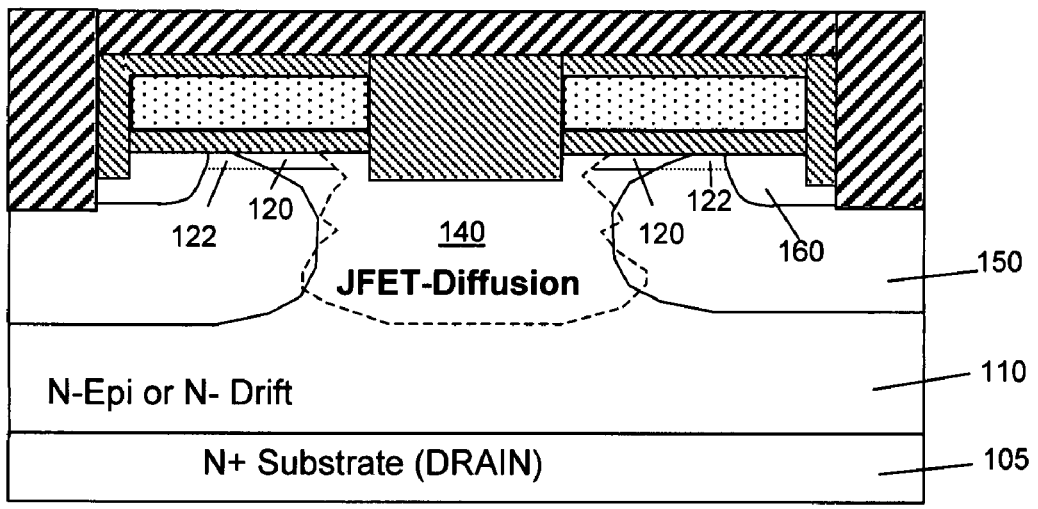
Figure 6A:
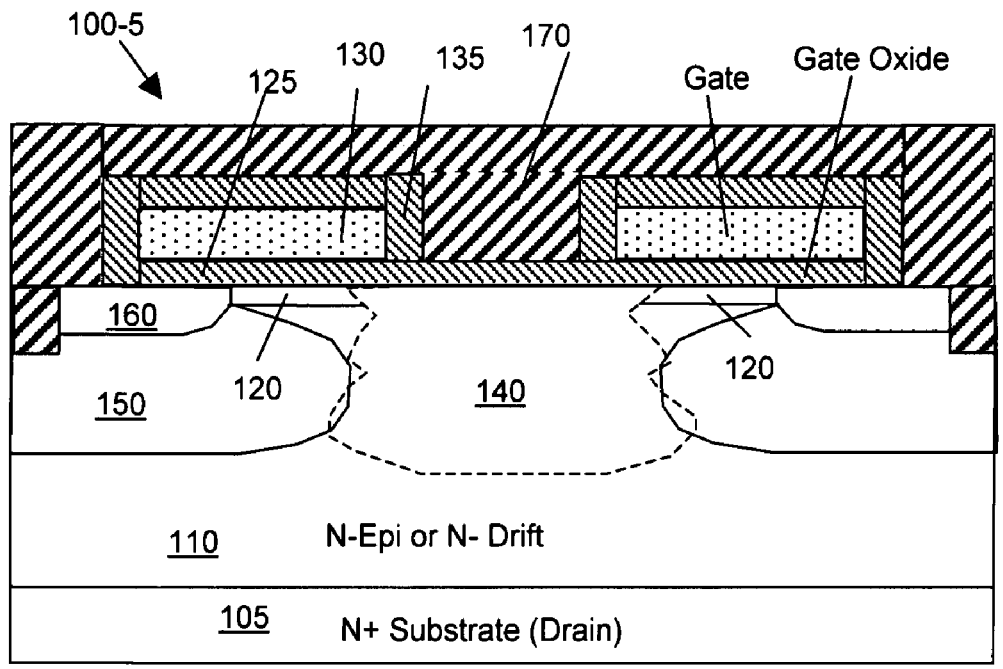
FIGS. 6A to 6D are four alternate cross sectional views of improved planar MOSFET with a source electrode penetrating into a space surrounded by a polysilicon gate of this invention.
Figure 6B:
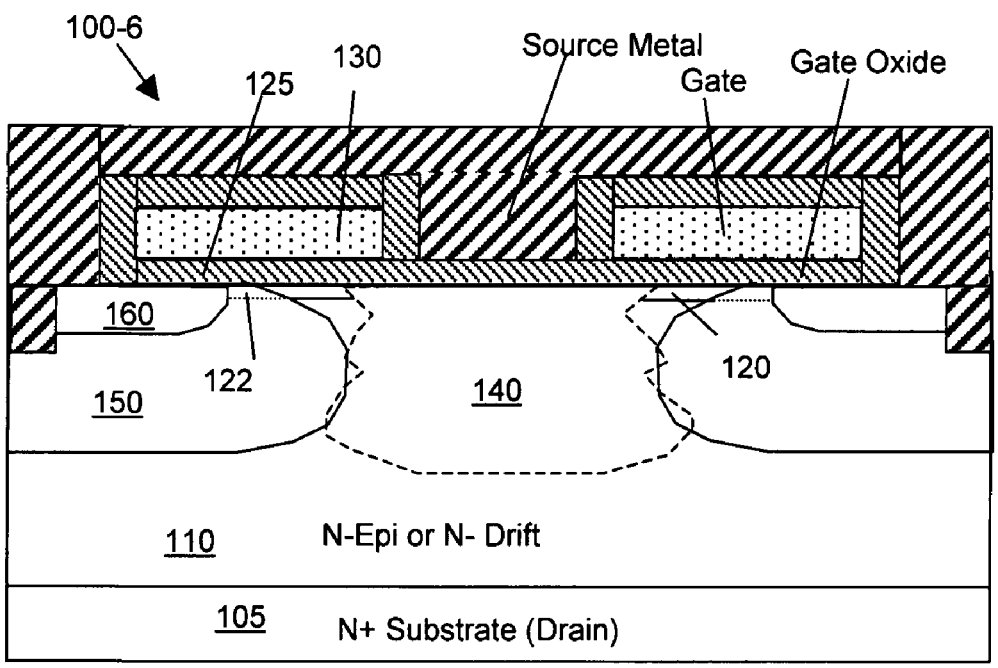
Figure 6C:
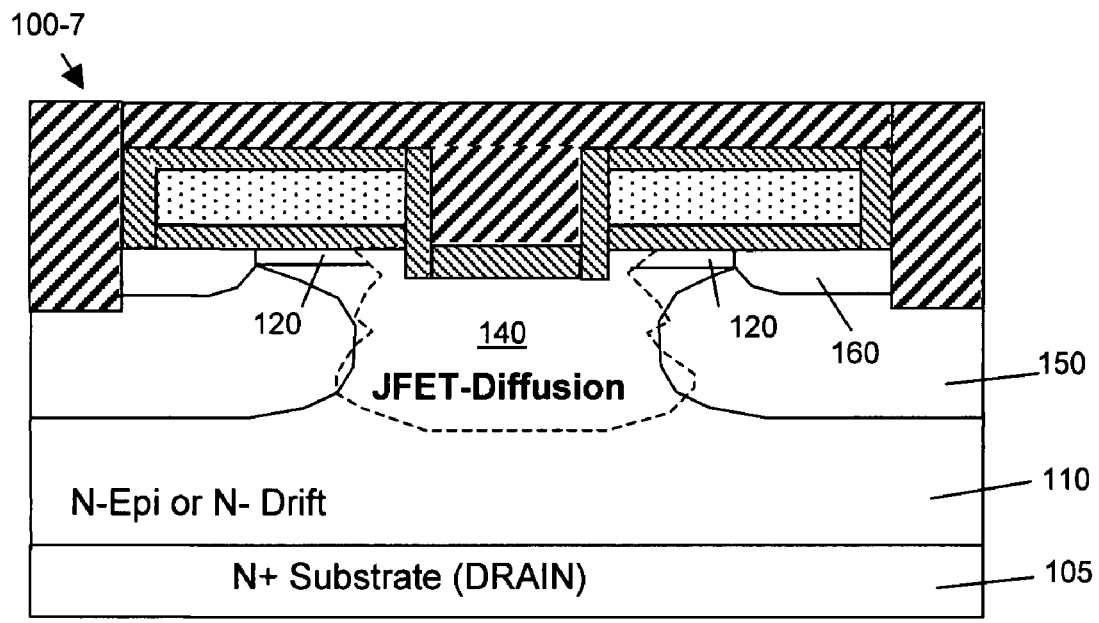
Figure 6D:
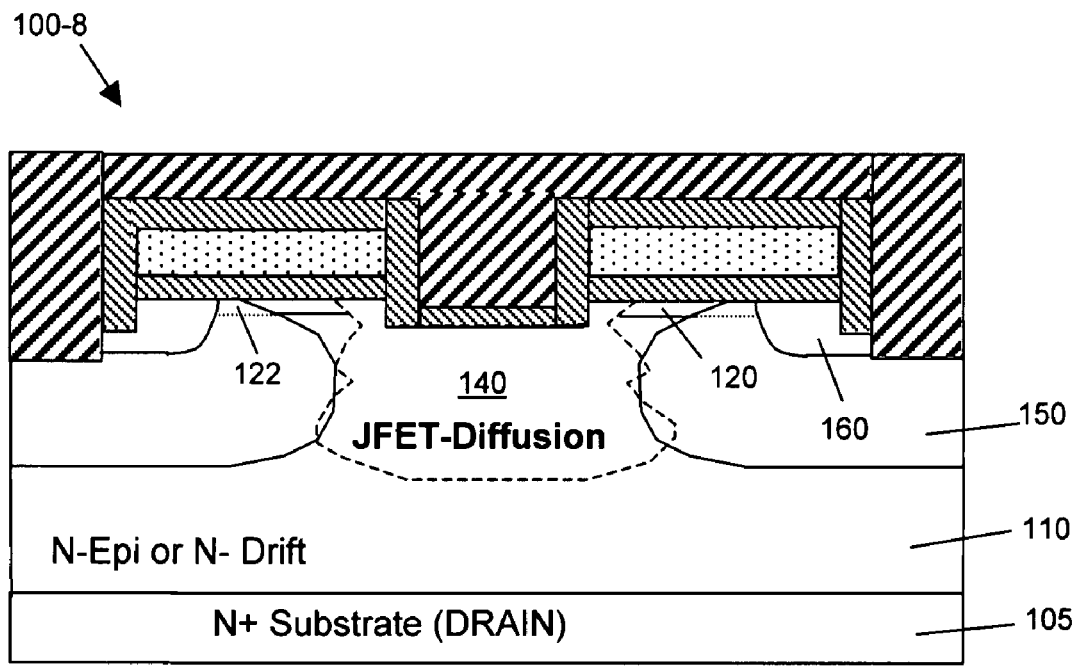
Figure 7A:
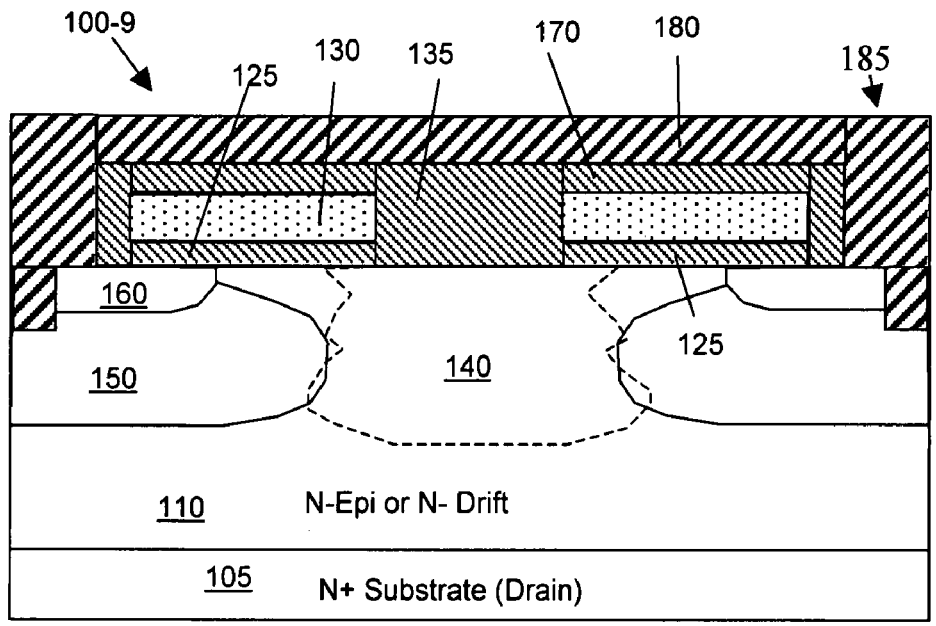
Figure 7B:
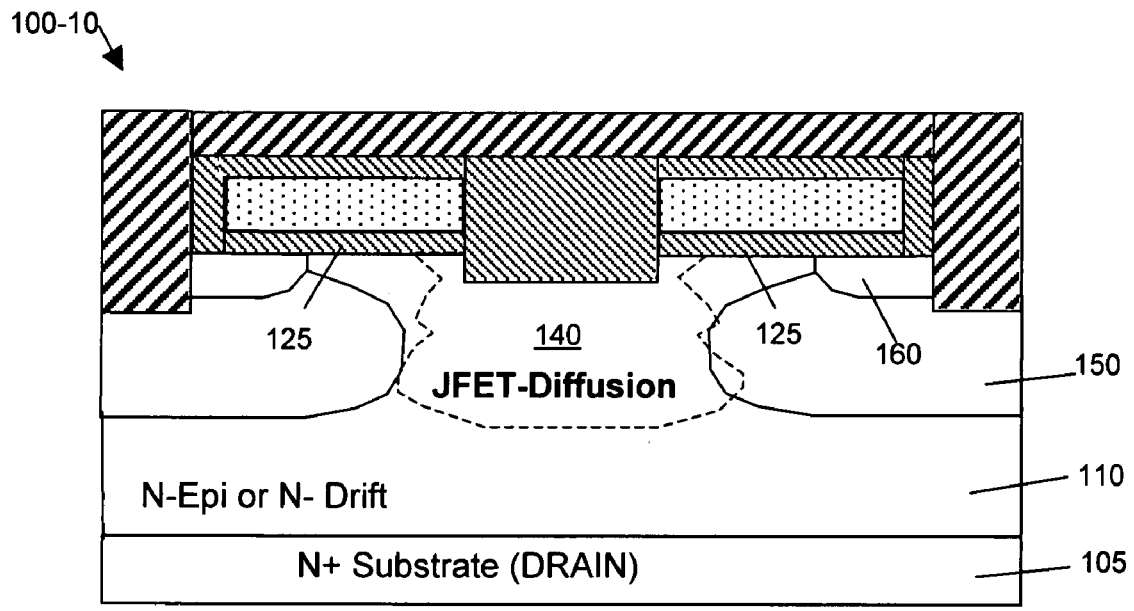
Figure 7D:
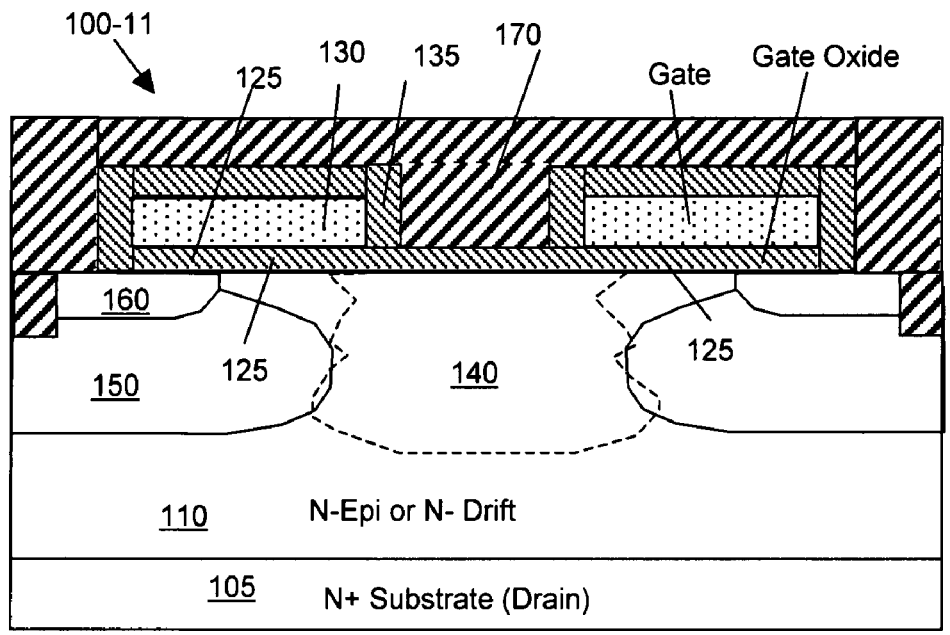
Figure 7D:
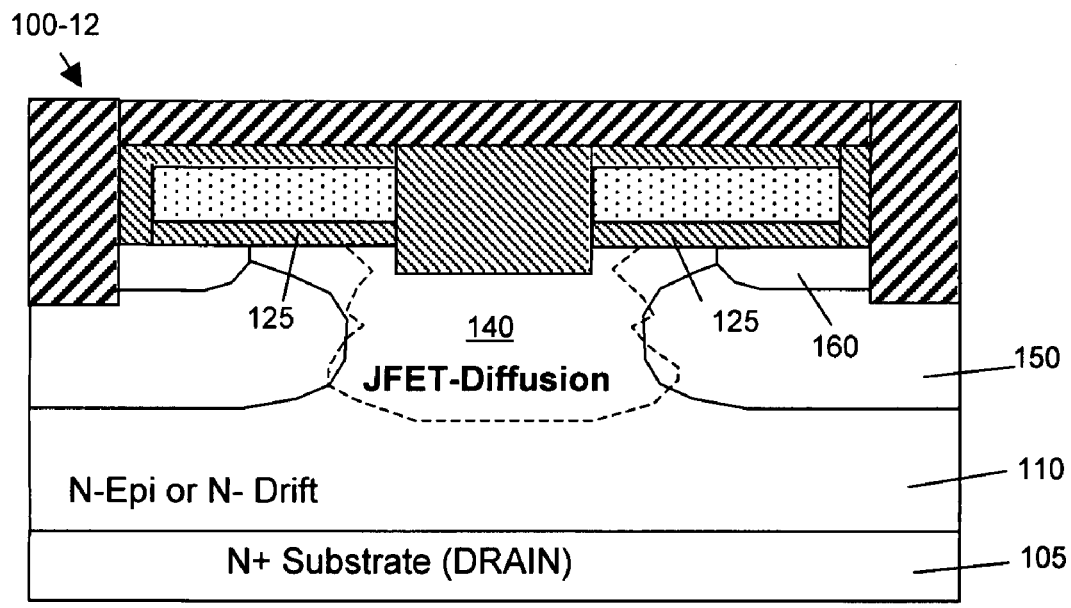

Referring to FIGS. 5A and 5B for MOSFET device 100-3 and 100-4 as alternate embodiments of this invention, the device configurations of the MOSFET devices 100-3 and 100-4 are similar to the MOSFET device 100-1 and 100-2 as shown in FIG. 2A and FIG. 4A. The only difference is that a portion of the top surface of the substrate not covered by the gate oxide is etched off to recess the silicon to a predetermined depth. This configuration is accomplished by etching the gate oxide 225 and a top layer of the shallow dopant region 220 and the epitaxial layer 210 after the polysilicon etch as that shown in the last step of FIG. 3A. Furthermore, lateral diffusion of the JFET implant regions and tilt implant of the body dopant as that shown in FIG. 3C are used to link the channels to drain and link the sources to the channels. The channel is located under the gate oxide. To establish a charge-conduction channel, both the source and drain need to be within the edge of gate. Lateral diffusion and tilt implant extent the source and drain-here is the JFET region into the regions under the gate.

Referring to FIGS. 6A-6D for four alternate embodiments 100-5, 100-6, 100-7 and 100-8 with similar structures as that shown in FIG. 2A, FIG. 4A, FIG. 5A, and FIG. 5B respectively. The only difference is in the device shown in FIGS. 6A to 6D, the source metal 180 now penetrate into the gap opened in the central portion of the gate 130. The source metal 180 is electrically connected to the source regions 160 and further provided as a shield to shield the gate segments 130 from the epitaxial layer 110. For the purpose of further reducing the gate-drain capacitance Cgd, the dielectric layer 135 is thinned by a mask etching process then the source metal 180 introduced between the splitted segments of the gate electrode 130. The fringing field from the gate 130 to terminate at the epitaxial layer 110 in the conventional MOSFET cells is now terminated at the source metal 180 now disposed between the space extended across the splitted gate 130. The source metal 180 is held at a fixed DC potential in most applications thus shielding the gate from the large swings of the drain potential. The value of the Crss is therefore dramatically reduced. It is further an option to provide a thick oxide layer spacer (not shown) surrounding the gate 130 to provide enough alignment tolerance for opening the contact. Further details of structures similar to these embodiments are also disclosed in a co-pending application Ser. No. 11/125,506 assigned to the same Assignee of this Application. The disclosures made in the application Ser. No. 11/125,506 are hereby incorporated by reference in this Application.

An accumulation channel type device is a device that is at "on" state when 0 gate voltage applied. The devices as that shown in FIG. 2A, FIG. 5A and FIG. 6A and FIG. 6C can also be configured as Accumulation Channel Type device in which there is no surface P channel implant. When the diffusion of deep P+ region is controlled not to reach the gate oxide, an accumulation channel exists below the gate oxide connecting the source to the JFET diffusion region. The device is on when the gate voltage is 0. When a negative gate voltage is applied to deplete this channel, the device is turned off. This is different from the operation of a normal DMOS device in which the channel needs to be inverted by a gate voltage to conduct.

Figure 8:
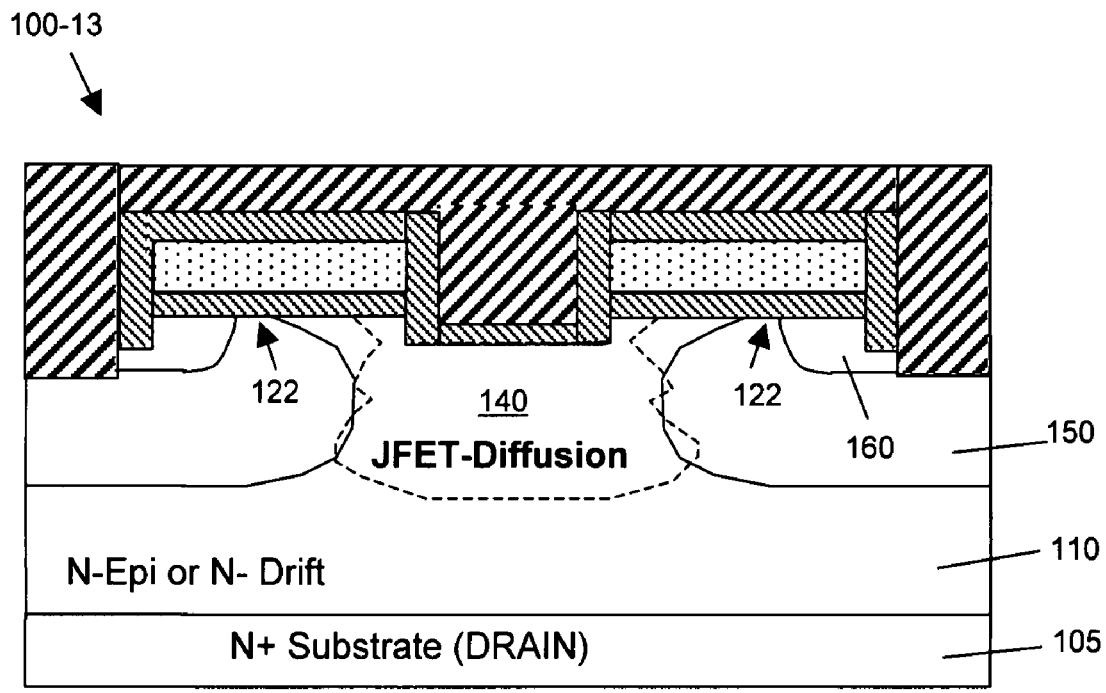
FIG. 8 is a side cross sectional view for an alternate embodiment for a split gate DMOS device of this invention.

Referring to FIG. 7A to 7D for four MOSFET devices 100-9, 100-10, 100-11 and 100-12 as alternate accumulation channel type embodiments of this invention. The MOSFET devices 100-9, 100-10, 100-11 and 100-12 have similar device configurations as FIG. 2A, FIG. 5A, FIG. 6A and FIG. 6C. The only difference is that the MOSFET devices 100-9, 100-10, 100-11 and 100-12 do not have a shallow surface dopant region 120 formed by a low dose shallow implant process. When the up diffusion of P+ region is controlled not to reach the gate oxide in the channel region, the device operates in accumulation mode where an accumulation channel extends below the gate oxide connecting the source to the JFET diffusion region. The devices are on when the gate voltage is 0. When a negative gate voltage is applied to deplete this channel, the devices are turned off. When a portion of P+ region is diffused to reach the gate oxide beyond the source region, the devices operates as normal DMOS. FIG. 8 shows such an alternate embodiment of this invention that a portion of P+ region 150 is diffused to reach the gate oxide 125 beyond the source region 160 forming a channel 122. Device 100-13 as shown in FIG. 8 is configured as a split gate structure to reduce the gate-drain capacitance Cgd with a JFET diffusion region 240 implanted through the gap between split gates 130 to reduce on resistance. A source metal 180 penetrates into the gap between split gates 130 to further reduce the gate-drain capacitance Cgd. The device 100-13 operates as a normal DMOS.

Figure 9:
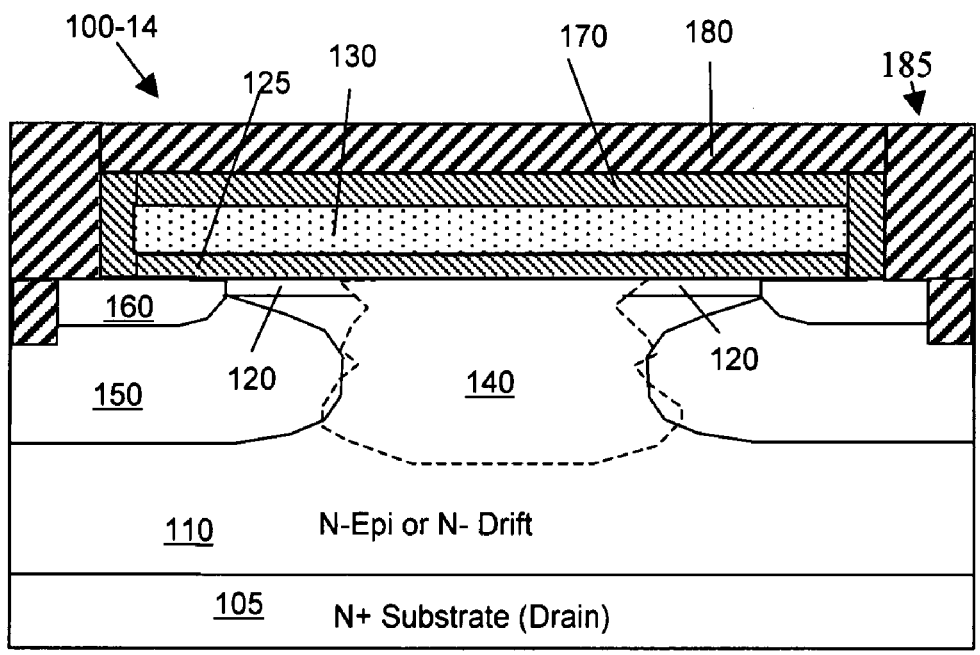
FIG. 9 and FIG. 10 are two side-cross sectional views for two alternate embodiments for a non-split gate device of this invention.

Referring to FIG. 9 for another MOSFET device 100-14 as an alternate preferred embodiment of this invention. The MOSFET device 100-14 has a similar device configuration as FIG. 2. The only difference is that the MOSFET device 100-14 does not have a split gate structure. A shallow surface dopant region 120 formed by a low dose shallow implant process supplies a channel with uniform dopant level that provides the benefit of precision control of gate threshold and improved channel punch-through resistance.

Figure 10:
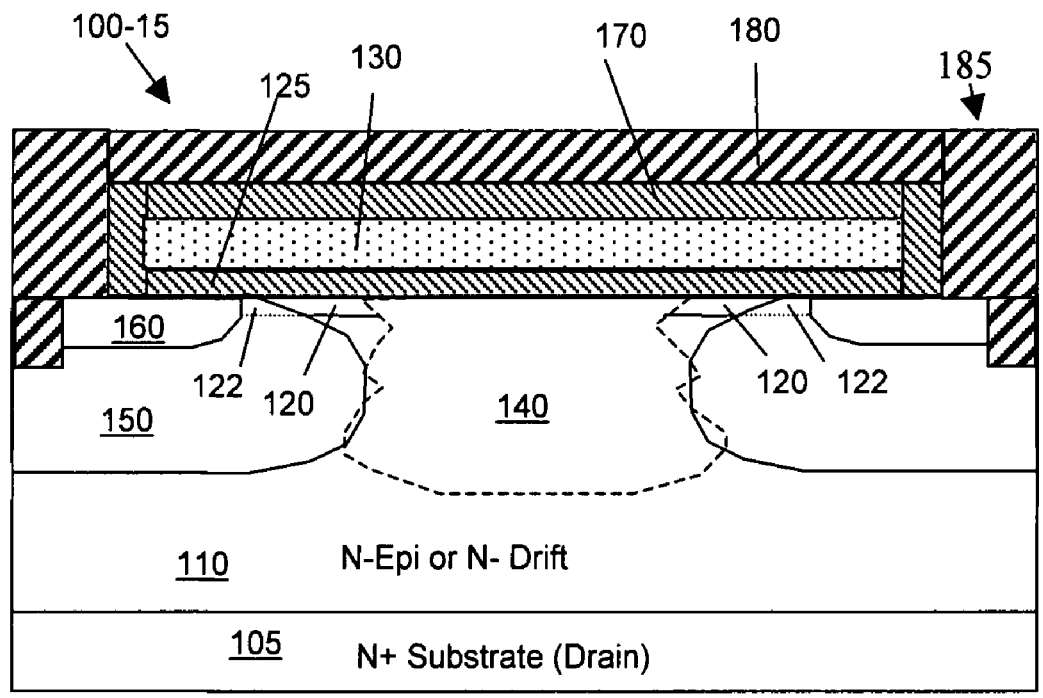

Referring to FIG. 10 for another MOSFET device 100-15 as an alternate preferred embodiment of this invention. The MOSFET device 100-15 has a similar device configuration as FIG. 9. The only difference is that in MOSFET device 100-15 the P+ region up diffuses into a portion of the shallow surface doped layer 120 forming a portion of channel 122. As the channel portion 122 has higher dopant density as shown in FIG. 4B, the threshold is now determined by this higher dopant channel region. The precision and stability of threshold therefore cannot be as precise controlled. However the substantially uniform and high channel dopant density improves the channel punch-through resistance.

Figure 11:
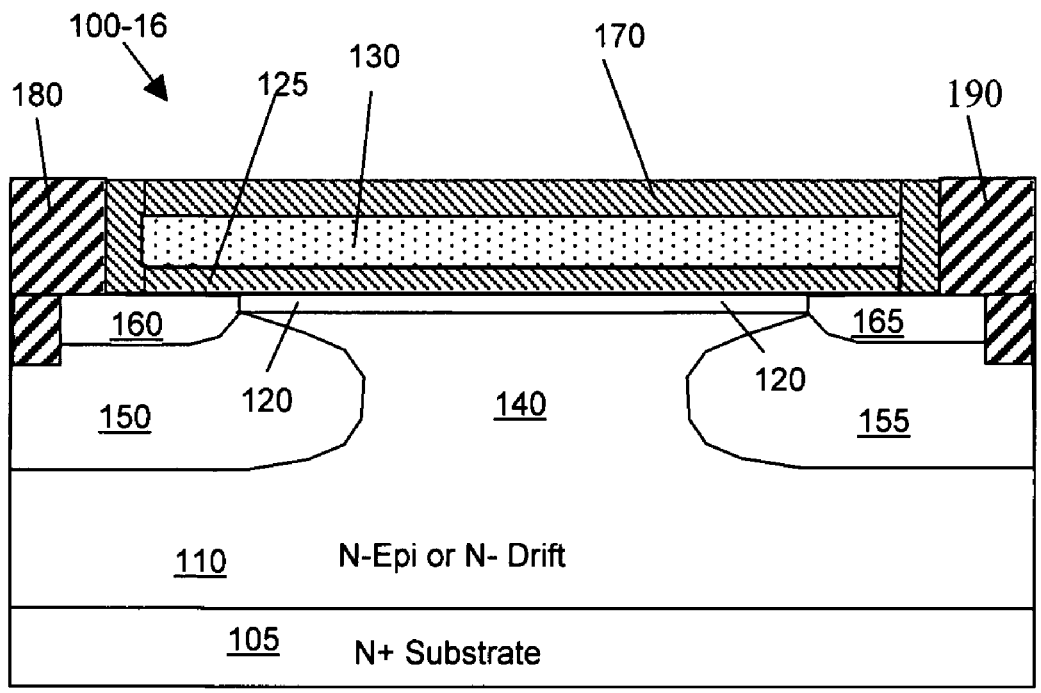
FIG. 11 is a cross sectional view for a lateral MOSFET of this invention.

Referring to FIG. 11 for another MOSFET device 100-16 as an alternate preferred embodiment of this invention. Compare to device configuration in FIG. 9, the MOSFET device 100-16 has a drain 165 that is on the same top surface as the source 160, connecting to drain metal 190 and source metal 180 respectively. The device as shown in FIG. 11 is a lateral MOSFET device. A shallow surface doped layer 120 forms a laterally uniform channel 122. The precision and stability of threshold therefore can be precisely controlled. Furthermore body regions 150 and 155 surrounding the source region 160 and drain region 165 to prevent direct conduction between source and drain.

According to FIGS. 2 to 11 and above descriptions, this invention discloses a method to manufacture a MOSFET device that is conceptually different from traditional DMOS. The method includes a step of performing a low dose blanket surface implantation of a dopant to form a channel with flat dopant profile to stabilize threshold voltage. This invention further discloses a method to reduce a capacitance of a vertical semiconductor power device having a planar gate. In a preferred embodiment, the method further includes a step of forming a split planar gate by opening a gap in the planar gate to reduce an area of the gate. In another preferred embodiment, the step of forming the doped region in a semiconductor substrate further includes of implanting dopant ions from the gap in the split gate to form the doped region to reduce device on resistance. In another preferred embodiment, the method further includes a step of performing a low dose blanket implantation of a surface dopant to form the shallow surface dopant region before a formation of the split gate. In another preferred embodiment, the method further includes a step of self-aligned angle implant a deep p-body region below the shallow surface dopant layer to stop punch through. In another preferred embodiment, the step of implanting dopant ions from the gap in the split gate further includes a step of performing multiple implants and JFET diffusion processes to form a deep vertical diffusion region below the gap. In another preferred embodiment, the step of performing multiple implants and JFET diffusion processes further includes a step of first implanting a perpendicular shallow phosphorus to counter dope the shallow surface dopant layer followed by high-energy arsenic or phosphorus implantations to form a deep vertical diffusion region below the gap. In another preferred embodiment, the method further includes a step of etching a gate oxide and a top surface of the semiconductor substrate to form a recess-silicon configuration after a polysilicon etch process in forming the split gate. In another preferred embodiment, the method further includes a step of removing a portion of the oxide inside the gap between the split gate and filled with source metal to further shield off the fringing filed and reduce gate to drain capacitance.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, the concept of flat channel dopant can be applied to non-split-gate planar MOSFET. Accordingly, it is intended that the appended claims be interpreted as covering all alterations and modifications as fall within the true spirit and scope of the invention.

We claim:

1. A method to produce a semiconductor MOSFET device having a planar gate, the method comprising:
    forming a surface doped region in a semiconductor substrate to provide at least a portion of a channel;
    forming a split planar gate on top of said semiconductor substrate by opening a gap in said planar gate to further reduce an area of said gate; and
    implanting dopant ions from said gap in said split gate to form a JFET diffusion region near a top surface of a drift layer under said gate adjacent to said JFET diffusion region wherein said JFET diffusion region having a dopant concentration higher than said drift layer.

2. The method of claim 1 wherein:
    said step of forming said surface doped region further comprising a step of performing a low dose blanket implantation of a surface dopant to form said surface doped region as a shallow surface dopant region.

3. The method of claim 1 wherein:
    said step of implanting said dopant ions from said gap in said split gate further comprising a step of performing multiple implants followed by performing JFET diffusion processes to form a deep vertical diffusion region below said gap.

4. The method of claim 1 wherein:
    said step of forming said split planar gate further comprising a step of etching a gate oxide and a top surface of said semiconductor substrate to form a recess-silicon configuration after a polysilicon etch process in forming said split gate.

5. The method of claim 1 further comprising:
    implanting body dopant ions with a tilt angle through said gap of the split gate for implanting body dopant ions into a region underneath said gate as a self-aligned implanting process to form body regions for said semiconductor power device.

6. The method of claim 3 wherein:
said step of performing the multiple implants and the JFET diffusion processes further comprising a step of first implanting low energy phosphorus dopant ions perpendicularly through said gap in said split gate followed by implanting high-energy arsenic or phosphorus dopant ions to form a deep vertical diffusion region below said gap.

* * * * *